US012641918B2

(12) United States Patent
Asuo et al.

(10) Patent No.: US 12,641,918 B2
(45) Date of Patent: May 26, 2026

(54) DOPED MIXED CATION PEROVSKITE MATERIALS AND DEVICES EXPLOITING SAME

(71) Applicants: Ivy Mawusi Asuo, Montreal (CA); Dawit Minale Gedamu, Montreal (CA); Ibrahima Ka, St. Hubert (CA); Sylvain Cloutier, Saint-Basile-le-Grand (CA); Riad Nechache, Montreal (CA); Alain Pignolet, Montreal (CA)

(72) Inventors: Ivy Mawusi Asuo, Montreal (CA); Dawit Minale Gedamu, Montreal (CA); Ibrahima Ka, St. Hubert (CA); Sylvain Cloutier, Saint-Basile-le-Grand (CA); Riad Nechache, Montreal (CA); Alain Pignolet, Montreal (CA)

(73) Assignee: SOCOVAR SOCIETÉ EN COMMANDITE, Québec City (CA)

( * ) Notice: Subject to any disclaimer, the term of this patent is extended or adjusted under 35 U.S.C. 154(b) by 701 days.

(21) Appl. No.: 17/617,114

(22) PCT Filed: Jun. 12, 2020

(86) PCT No.: PCT/CA2020/050809
§ 371 (c)(1),
(2) Date: Dec. 7, 2021

(87) PCT Pub. No.: WO2020/248063
PCT Pub. Date: Dec. 17, 2020

(65) Prior Publication Data
US 2022/0173365 A1     Jun. 2, 2022

Related U.S. Application Data

(60) Provisional application No. 62/860,384, filed on Jun. 12, 2019.

(51) Int. Cl.
*H10K 85/50* (2023.01)
*C01G 21/00* (2006.01)
(Continued)

(52) U.S. Cl.
CPC ........... *H10H 20/01* (2025.01); *C01G 21/006* (2013.01); *H10K 30/20* (2023.02); *H10K 30/40* (2023.02);
(Continued)

(58) Field of Classification Search
CPC ........ H10K 71/00; H10K 30/82; H10K 30/88; H10K 50/805; H10K 71/13; H10K 71/441;
(Continued)

(56) References Cited

U.S. PATENT DOCUMENTS

2016/0343965 A1*  11/2016  Marks .................. C08G 61/123
2018/0218845 A1*  8/2018  Tan ...................... H01G 9/2072
(Continued)

FOREIGN PATENT DOCUMENTS

EP          3272757 A1     1/2018
JP      2016178274 A   *  10/2016
(Continued)

*Primary Examiner* — Samuel Park
(74) *Attorney, Agent, or Firm* — Rosenberg, Klein & Lee

(57) ABSTRACT

Organic-inorganic halide perovskite (OIHP) materials through their promising material properties, simple solution processability, low material cost, high photon absorption, carrier mobilities, and tunable band gap are suitable for large area coatings in the fabrication of optical displays, LEDs, photovoltaic cells and photodetectors. However, OIHP stability and shelf life have been limited to date as exposed perovskite films do not survive long in ambient air causing further issues for large scale OIHP based device production and deployment. Accordingly, the inventors have established three-cation material system variants using an inno-
(Continued)

400A  400B vative single solution thiocyanate (SCN) doped three cation material system allowing tailoring of perovskite grain size and microstructure to minimize degradation from exposure to atmospheric conditions. Further, solvent engineering techniques using the innovative single solution SCN doped three cation material system established by the inventors allow for large area processing, compact OIHP films with large crystal grains (>4 μm), and passivated grain boundaries.

6 Claims, 8 Drawing Sheets

(51) Int. Cl.

| | |
|---|---|
| *H10H 20/01* | (2025.01) |
| *H10K 30/20* | (2023.01) |
| *H10K 30/40* | (2023.01) |
| *H10K 30/82* | (2023.01) |
| *H10K 30/88* | (2023.01) |
| *H10K 71/13* | (2023.01) |
| *H10K 71/40* | (2023.01) |
| *H10K 30/10* | (2023.01) |
| *H10K 30/15* | (2023.01) |
| *H10K 30/50* | (2023.01) |

(52) U.S. Cl.
CPC ............ *H10K 30/82* (2023.02); *H10K 30/88* (2023.02); *H10K 71/13* (2023.02); *H10K 71/441* (2023.02); *H10K 85/50* (2023.02); *C01P 2002/34* (2013.01); *C01P 2002/52* (2013.01); *H10K 30/10* (2023.02); *H10K 30/151* (2023.02); *H10K 30/50* (2023.02)

(58) Field of Classification Search
CPC ...... H10K 30/10; H10K 30/50; H10K 30/151; H10K 30/20; H10K 50/12; H10K 30/40; H10K 85/50; H10K 50/11; H10K 71/12; C01G 21/006; C01P 2002/34; C01P 2002/52; C01P 2002/72; C01P 2002/84; C01P 2004/03; C01P 2006/40; H01L 33/18; H01L 33/005; Y02E 10/549
See application file for complete search history.

(56) References Cited

U.S. PATENT DOCUMENTS

| | | | | |
|---|---|---|---|---|
| 2020/0294728 A1* | 9/2020 | Zhu | ..................... | H01G 9/2081 |
| 2021/0171557 A1* | 6/2021 | Huang | .................. | H10K 85/50 |
| 2022/0025195 A1* | 1/2022 | Huang | ................ | C09D 11/033 |
| 2022/0115602 A1* | 4/2022 | Snaith | ................. | H10K 85/111 |

FOREIGN PATENT DOCUMENTS

| | | | | |
|---|---|---|---|---|
| WO | 2014045021 A1 | 3/2014 | | |
| WO | 2016151535 A1 | 9/2016 | | |
| WO | WO-2017160955 A1 * | 9/2017 | ............ | H10K 85/50 |
| WO | 2017195191 A1 | 11/2017 | | |
| WO | 2018068101 A1 | 4/2018 | | |

* cited by examiner

DOPED MIXED CATION PEROVSKITE MATERIALS AND DEVICES EXPLOITING SAME

CROSS-REFERENCE TO RELATED APPLICATIONS

This patent application claims the benefit of priority as a 371 National Phase Entry Application of PCT/CA2020/050809 filed Jun. 12, 2020 which itself claims the benefit of priority from U.S. Provisional Patent Application 62/860,384 filed Jun. 12, 2019 entitled "Doped Mixed Cation Perovskite Materials and Device Exploiting Same", the entire contents of each being incorporated herein by reference.

FIELD OF THE INVENTION

This patent application relates to opto-electronic semiconductor materials and more particularly to doped hybrid perovskite materials for use as opto-electronic semiconductor materials with improved environmental stability and reduced manufacturing complexity as well as opto-electronic devices exploiting such doped hybrid perovskite materials.

BACKGROUND OF THE INVENTION

Organic-inorganic halide perovskite (OIHP) materials of general formula ABX3 (A=cation/s such as methylammonium (MA) or formamidinium (FA) or Cs or combinations thereof, B=Pb, and X=I, Br, Cl or combinations thereof) materials have recently attracted great interest due to their promising material properties, simple solution processability and low material cost which makes them compatible to the requirements in the direction of large area coatings. Further, their high photon absorption, carrier mobilities, and tunable band gap, between 1.5 eV and 2.2 eV, make them particularly advantageous for applications such as optical displays, light emitting diodes (LEDs), photovoltaic (PV) cells (e.g. solar cells, tandem solar cells) and photodetectors.

However, despite the progress made in the last few years with respect to these materials the processing of OIHPs under room atmosphere conditions remain an issue. Further, the stability and shelf life of OIHP devices, such as solar cells, under normal temperatures and exposure to air is poor. The shelf life is very short and the device performance unstable due to the OIHP material's strong affinity for humidity. Accordingly, OIHP material synthesis and thin film fabrication are usually performed within an inert atmosphere, e.g. nitrogen, as an exposed perovskite film will not survive very long in ambient air. This is obviously a significant issue for both large scale OIHP based device production and deployment.

A perovskite film coated onto substrates under ambient conditions is porous and exhibits a poor crystalline quality which requires that the perovskite film be coated within the inert environment so that 100% surface coverage and protection of the perovskite film can be achieved. However, this requirement for processing under an inert environment results in additional costs and increased large scale production complexity. Accordingly, it would be beneficial to exploit a perovskite material that is stable and processable under ambient atmosphere thereby allowing a reduction in processing and coating complexity and thereby cost of OIHP devices.

Within the prior art, there have been several routes explored to address these challenges caused by ambient processing through optimizing the synthesis and coating conditions so that a highly compact OIHP film with large crystal grains is produced. An ideal perovskite film should be microscopically pinhole-free, composed of large crystal grains and smooth since microstructural evolution of the OIHP thin film including size of crystal grains and grain boundaries significantly affect device performance. These prior art alternative technologies focus directly or indirectly on achieving high quality perovskite film which can be based on single, double or triple cation systems. In all of these systems, high quality OIHP thin films can be obtained under optimized processing and coating conditions in obtaining better performing devices.

The process of obtaining compact and large crystal grain thin film on a substrate are challenging, but crucial parameters for high-performance devices such as perovskite solar cells (PSCs). Further, exposure to an ambient environment decreases the stability of the OIHP by facilitating the decomposition of the OIHP material into its photoinactive constituents such as lead (II) iodide ($PbI_2$) in a few minutes. Accordingly, it would be beneficial to provide device designer and device manufacturers with a perovskite material system processable at ambient environment regardless of the humidity and oxygen content in the room atmosphere.

Accordingly, the inventors have established a variant of the three-cation material system which is known from the prior art to exhibit stable photovoltaic performance within nitrogen environments. The innovative single solution doped three cation material system established by the inventors allows for tailoring the perovskite grain size and microstructure to minimize degradation from exposure to atmospheric conditions to the morphology and crystal quality. Further, by exploiting a solvent engineering technique, the innovative single solution doped three cation material system established by the inventors allows not only for large-area processing whilst yielding a compact OIHP film with large crystal grains (>4 μm) but also provides passivated grain boundaries.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations within the prior art relating to opto-electronic semiconductor materials and more particularly to doped hybrid perovskite materials for use as opto-electronic semiconductor materials with improved environmental stability and reduced manufacturing complexity as well as opto-electronic devices exploiting such doped hybrid perovskite materials.

In accordance with an embodiment of the invention there is provided a method of forming an optoelectronic device comprising:

depositing one or more first layers of the optoelectronic device to form a lower portion of the optoelectronic device;

depositing a doped perovskite film to form an active layer of the optoelectronic device; and depositing one or more second layers of the optoelectronic device to form an upper portion of the optoelectronic device; wherein the doped perovskite film is formed from a doped triple cation perovskite solution established by doping a triple cation perovskite solution.

In accordance with an embodiment of the invention there is provided a method of forming a precursor comprising:

dissolving a number of individual components in one or more organic solvents; and dissolving an additive with the number of individual components; wherein the precursor provides for a doped perovskite film when processed onto a substrate;

the precursor is a doped triple cation perovskite solution; and the precursor allows formation of doped perovskite films in ambient conditions.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
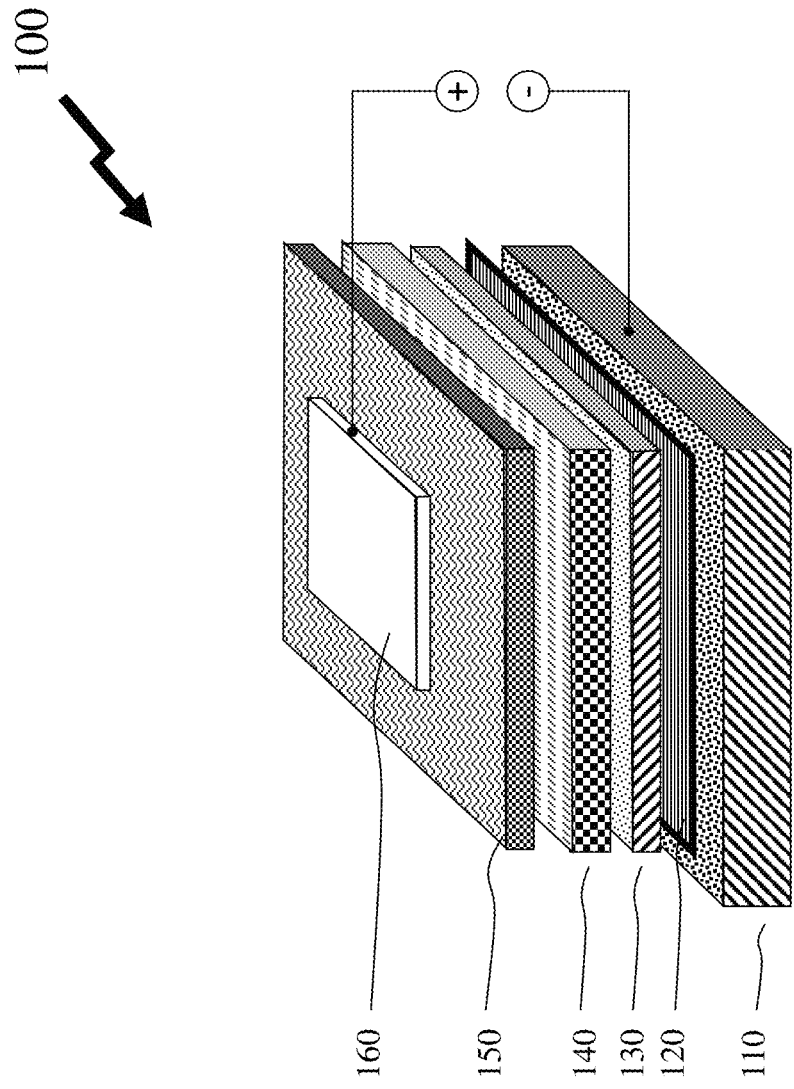
FIG. 1 depicts a schematic representation of a multilayer heterostructure architecture of an exemplary perovskite based solar cell exploiting OIHP materials according to embodiments of the invention.

The present invention is direct to opto-electronic semiconductor materials and more particularly to doped hybrid perovskite materials for use as opto-electronic semiconductor materials with improved environmental stability and reduced manufacturing complexity as well as opto-electronic devices exploiting such doped hybrid perovskite materials.

The ensuing description provides representative embodiment(s) only, and is not intended to limit the scope, applicability or configuration of the disclosure. Rather, the ensuing description of the embodiment(s) will provide those skilled in the art with an enabling description for implementing an embodiment or embodiments of the invention. It being understood that various changes can be made in the function and arrangement of elements without departing from the spirit and scope as set forth in the appended claims. Accordingly, an embodiment is an example or implementation of the inventions and not the sole implementation. Various appearances of "one embodiment," "an embodiment" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention can also be implemented in a single embodiment or any combination of embodiments.

Reference in the specification to "one embodiment", "an embodiment", "some embodiments" or "other embodiments" means that a particular feature, structure, or characteristic described in connection with the embodiments is included in at least one embodiment, but not necessarily all embodiments, of the inventions. The phraseology and terminology employed herein is not to be construed as limiting but is for descriptive purpose only. It is to be understood that where the claims or specification refer to "a" or "an" element, such reference is not to be construed as there being only one of that element. It is to be understood that where the specification states that a component feature, structure, or characteristic "may", "might", "can" or "could" be included, that particular component, feature, structure, or characteristic is not required to be included.

Reference to terms such as "left", "right", "top", "bottom", "front" and "back" are intended for use in respect to the orientation of the particular feature, structure, or element within the figures depicting embodiments of the invention. It would be evident that such directional terminology with respect to the actual use of a device has no specific meaning as the device can be employed in a multiplicity of orientations by the user or users.

Reference to terms "including", "comprising", "consisting" and grammatical variants thereof do not preclude the addition of one or more components, features, steps, integers or groups thereof and that the terms are not to be construed as specifying components, features, steps or integers. Likewise, the phrase "consisting essentially of", and grammatical variants thereof, when used herein is not to be construed as excluding additional components, steps, features integers or groups thereof but rather that the additional features, integers, steps, components or groups thereof do not materially alter the basic and novel characteristics of the claimed composition, device or method. If the specification or claims refer to "an additional" element, that does not preclude there being more than one of the additional element.

Exemplary Solar Cell Geometry

Within the following description with respect to the manufacturing of OIHP films and devices according to embodiments of the invention the experimental device results are presented with respect to a typical photovoltaic (PV) application based upon a multilayer heterostructure architecture as depicted in FIG. 1.

FIG. 1 depicts a full-stack multilayered structure of a three-dimensional (3D) perovskite solar cell (PSC) 100 showing each layer and junction. The conventional 3D geometry comprises a stacked sequence of:

Fluorine doped Tin Oxide (FTO) 110 glass;

Lower charge extracting structure comprising:

Electron Transport Layer (ETL) 120;

Semiconductor material (e.g. mesoporous titanium dioxide, MP-TiO$_2$);

Perovskite semiconductor material (PE) 140;

Upper charge extracting structure comprising:

Hole Transport Layer (HTL) 150; and

Upper electrode, Au 160.

Accordingly, the thin film of perovskite (PE) 140 semiconductor material is disposed between a pair of charge extracting layers, namely an upper charge extracting structure comprising a hole transporting layer (HTL) 150 and a lower charge extracting structure comprising an electron transporting layer (ETL) with a semiconductor material 130 layer, such as mesoporous TiO$_2$ (MP-TiO$_2$) which provides an n-type semiconductor material, disposed between the ETL 120 and PE 140.

According to different designs for the PSC 100 the ETL 120 materials may, for example, be titanium dioxide (TiO$_2$), tin oxide (SnO$_2$) or [6,6]-phenyl-C61-butyric acid methyl ester (PCBM). According to different designs for the PSC 100 and the HTL 150 may, for example, be 2,2',7,7'-Tetrakis-(N,N-di-4-methoxyphenylamino)-9,9'-spirobifluorene (Spiro-MeOTAD), copper (1) thiocyanate (CuSCN), and poly(3,4-ethylenedioxythiophene):polystyrene sulfonate (PEDOT:PSS).

For example, using TiO$_2$ and Spiro-MeOTAD charge extractors with 500 nm of OIHP treated with a mixture of chlorobenzene to ethanol, a maximum power conversion efficiency (PCE) of approximately 21% and fill factor (FF) of approximately 73% have been achieved by the inventors for the 3D PSC 100.

Experimental results of devices fabricated with copper (1) thiocyanate (CuSCN) as the HTL 150 are described and depicted with respect to FIGS. 7 and 8 below.

Further, as will become evident with respect to the subsequent description the novel OIHP materials as established by the inventors employed in exemplary PSC 100 demonstrations are an advance upon the prior art in offering a path towards the realization highly efficient and ambient processable perovskite materials for low cost opto-electronic devices and low cost opto-electronic device applications. As will become evident, the low complexity and robust processing techniques that can be employed with the innovate perovskite materials allow for large area coatings to be achieved, allowing for solar cell module fabrication and mass fabrication.

Novel Perovskite Material and Manufacturing Methodology

Amongst the issues limiting the commercialization of perovskites-based devices their efficiency is not one of these. Within the prior art solar cells exploiting perovskite materials fabricated under controlled environments have achieved efficiencies of 25.2%, compared with 6% for an amorphous silicon solar cell. Similarly, perovskite based light emitting diodes (LEDs) have seen demonstrated external quantum efficiency (EQE) increase through developments from approximately 0.8% in 2014 to 10.4% in 2017. Further device optimizations, thereby promising further improvements, could lead to perovskite based LEDs offering competition to LEDs employing semiconducting polymers and quantum dots which achieve an EQE of 20%. Further, perovskite based photodetectors (PDs) have been demonstrated with responsivities of 10$^9$ A·W$^{-1}$ and the detectivity of 10$^{14}$ Jones, respectively. Further, recent improvements in the response time of these photodetectors have demonstrated nanosecond response times such that the performance of perovskites based PDs can compete with several common PD material systems.

However, some challenging aspects regarding the synthesis environment and the stability of perovskites materials, especially for optoelectronic applications still have to be addressed as outlined above. Accordingly, a significant requirement within all of these devices and their applications is a perovskite material system which offers high quality films with good environmental stability and low complexity processing/manufacturing in order to provide lower manufacturing costs and high volume/large area manufacturing methodologies in conjunction with devices offering competitive short term and long term performance.

At this point, the inventors have established a range of highly stable perovskite material which are synthesizable in ambient atmosphere. Due to the timing of this patent application relative to the initial devices being manufactured and tested the stability duration data is currently limited to only approximately ten months (300 days) in air, but the evident difference in performance over this timeframe is evidence of the enhanced properties of the innovative perovskite materials according to embodiments of the invention.

Accordingly, embodiments of the invention exploit the following:

a solvent treatment process that leads to the improvement of the perovskite film morphology; and/or a thiocyanate (SCN) doping of the triple cation perovskite solution.

Perovkite Precursor Preparation

Exemplary perovskites according to embodiments of the invention as defined FA$_X$MA$_Y$Cs$_Z$Pb$_V$I$_M$SCN$_Q$Br$_N$ where X, Y, Z, M, V, Q, N=0.0001 to 3 respectively were prepared as solutions by dissolving the individual components in a volumetric proportion of organic solvents, N,N'-dimethylformamide (DMF), and dimethyl sulfoxide (DMSO). This volumetric proportion being, for example, 4:1 v/v DMF: DMSO.

In order to obtain an exemplary perovskite solution, the inventors dissolved 32 mg of methylammonuim bromide (MABr), 220 mg of formamidinium iodide (FAI), 120 mg of methylammonium iodide (MAI), 370 mg of lead (II) iodide (PbI$_2$), and 230 mg of lead (II) bromide (PbBr$_2$), in 1.25 ml of the mixed organic solvents. This used a one-step solution preparation method although multiple steps may be employed. Then to this solution, 75 μl of cesium iodide (CsI) solution was added, at a concentration of 1.5 M dissolved in DMSO. Subsequently, lead thiocyanate ions (0-50 wt %) were added to the perovskite solution and then continually stirred for 30 mins-1 hour on a magnetic plate at room temperature. No heating was required.

At this point the perovskite solution could be spin-coated onto substrates to fabricate exemplary devices according to embodiments of the invention.

Formation of Perovskite Thin Films and Devices

Fluorine-doped tin oxide (FTO, TEC 15) glass substrates were used to fabricate the prototype devices according to embodiments of the invention. The substrates were initially cleaned in an ultrasonic bath with deionized water, acetone, and isopropanol successively for 10 minutes and then dried with compressed air. The cleaned substrates were then treated with UV-Ozone for 20 minutes preceding titanium dioxide (TiO$_2$) deposition. Planar and mesoscopic solar cells were fabricated via spin-coating each layer-by-layer deposition.

First, a compact TiO$_2$ layer of 60 nm, although can be typically in the range 10-200 nm, of 60 nm was spin coated from solution onto the cleaned-FTO substrates and then annealed at 550° C. for 45 minutes, although temperatures between 400° C.-600° C. are typically employed, in a quartz tube furnace and cooled to room temperature. Then, a diluted mesoporous TiO$_2$ paste (for example in ethanol at a 6:1 volume ratio) was spin-coated atop the compact TiO$_2$ layer. The substrates were then annealed again at 500° C. for 30 min. After cooling the substrates to room temperature, lithium-doping of the mesoporous layer was carried out under ambient conditions. Exemplary perovskite films and devices according to embodiments of the invention all took place under ambient conditions: 22° C.-25° C., and 25%-55% RH.

The perovskite solution was then deposited on the substrates by a two-step spin coating method. The first step by dispersing 100p of the perovskite precursor solution onto the FTO/TiO$_2$ layer and then spinning at between 500 and 4000 rpm for 5-500 s to obtain the desired film thickness. This was followed by solvent dripping of 100-1000 µl of the solvent and spinning at 1000-7000 rpm for 5-100 s and annealing the films at 60° C.-150° C. for 1-60 minutes. Exemplary devices for which results are presented below employed 5000 rpm for 20 s for the spinning and 120° C. for 15 mins for annealing. Annealing allowed for completion of the crystallization process of the perovskite and evaporation of excess solvents.

The hole-transporting material, Spiro-MeOTAD, was also deposited by spin-coating atop the FTO/CL-TiO$_2$/MP-TiO$_2$/perovskite layer. Finally, the devices were completed by thermal evaporation of a 100 nm gold layer, deposited at 0.2 nm/s at 5×10$^{-5}$ Torr. The active area for all the initial prototype devices was 0.067 cm$^2$, which was defined by the area of the shadow mask used during the thermal evaporation.

Accordingly, unlike prior art with respect to the formation of the perovskite films and devices employing the perovskite films all processing/synthesis, except gold deposition, was performed in ambient environments without requiring controlled conditions within controlled environments, e.g. glove boxes etc.

Variants

Whilst the perovskite films and devices employing perovskite films described within this specification were manufactured using DMF and DMSO as the solvents other solvents may be employed within the scope of the invention in combination with DMF and/or DMSO or in combination to replace DMF/DMSO. Such solvents may include, for example, acetonitrile, γ-Butyrolactone (GBL), ethanol, and isopropanol.

Within other embodiments of the invention the perovskite films may employ one or more dopants comprising a halide or pseudohalide containing S or C or N anions or combinations thereof. The addition of such dopant ions results in the substitution of I$^-$ in the perovskite structure. Such halide ions may include Cl and Br. A pseudohalide ion plays a similar role to Cl-, Br-, I$^-$ (the halides/halogens). Such dopants have been established by the inventors as providing perovskite films that are thermodynamically stable and accordingly improve the stability of the perovskite films and/or devices.

The perovskite films and devices described within this specification were fabricated using a solvent anti-solvent treatment. However, other embodiments of the invention may employ other solvents, either in combination with the solvent and anti-solvent or solely using one of them. For example, these solvents may include, ethanol, ethyl acetate, water, methanol, diethyl ether, toluene, and chlorobenzene. The inventors in fabricating films described herein have employed ethanol and chlorobenzene of volume ratios between 0-100% during the solvent dripping stage to obtain compact and large grains. The solvent anti-solvent treatment being described by the inventors within "Solvent-Antisolvent Ambient Processed Large Grain Size Perovskite Thin Films for High-Performance Solar Cells" (Nature, Scientific Reports Vol. 8, Article No. 12885, August 2018). However, in contrast to this previously reported work the volume percent of the combined solvents of ethanol and chlorobenzene for the perovskite films employed according to embodiments of the invention were different. In contrast to the previous perovskites the new perovskite works very well for any combination of ethanol and chlorobenzene. Even without the addition of the solvent, the solar cells achieved an efficiency of approximately 7%. These films and the subsequent devices employing them would be transparent making them beneficial for use in integrated building applications wherein the windows of the building could be coated with these transparent perovskite based solar cells.

Whilst the description above describes the use of FTO coated substrates it would be evident that a range of other substrates may be employed in conjunction with perovskite films according to embodiments of the invention including, but not limited to, flexible polymer substrates, polyethylene terephthalate (PET), and poly (4,4'-oxydiphenylene-pyromellitimide) (known as Kapton).

It would be evident that a range of other hole transport materials may be employed in conjunction with perovskite films according to embodiments of the invention other than N2,N2,N2',N2',N7,N7,N7',N7'-octakis(4-methoxyphenyl)-9,9'-spirobi[9H-fluorene]-2,2',7,7'-tetramine (Spiro-MeOTAD). These may include, but not be limited to, copper thiocyanate (CuSCN), copper iodide (CuI), poly(triaryl amine), poly[bis(4-phenyl)(2,4,6-trimethylphenyl)amine] (PTAA), and poly(3,4-ethylenedioxythiophene) polystyrene sulfonate (PEDOT:PSS).

It would be evident that a range of other electron transport materials may be employed in conjunction with perovskite films according to embodiments of the invention other than mesoporous TiO$_2$ (MP-TiO$_2$). These may include, but not be limited to, zinc oxide (ZnO), [6,6]-phenyl-C61-butyric acid methyl ester (PCBM), and bismuth iron oxide (BiFeO$_3$ or BFO).

It would be evident that a range of other contact electrodes may be employed in conjunction with perovskite films according to embodiments of the invention other than gold. These may include, but not be limited to, silver, aluminum, and carbon. Contact electrode thicknesses may typically be between 50 nm and 200 nm although other thicknesses may be employed. The inventors employed 100 nm.

It would be evident that a range of other manufacturing methodologies may be employed to deposit the perovskite films from solution according to embodiments of the invention other than spin coating. Such techniques may include, but not be limited to, drop casting, slot-die coating, dip coating, electrospinning, and screen printing.

It would be evident that a range of other optoelectronic devices may be fabricated exploiting perovskite films according to embodiments of the invention. These may include, but not be limited to, planar solar cells, inverted solar cells, mesoporous solar cells, tandem solar cells, light emitting diodes (LEDs), photodetectors, solar cell modules, and transparent devices for building integrated photovoltaics (BIPVs).

Experimental Results

As noted above the perovskites employed in forming devices and perovskite films according to embodiments of the invention are $FA_XMA_YCs_ZPb_VI_MSCN_QBr_N$ where X, Y, Z, M, V, Q, N=0.0001 to 3 employing a SCN doping of the triple cation perovskite solution. Accordingly, the inventor's novel perovskite film is a ternary perovskite framework (halide perovskite) where no chlorine is present and less lead iodide ($PbI_2$) is incorporated such that no excess $PbI_2$ is present within the perovskite film.

Figures 2A, 2B:
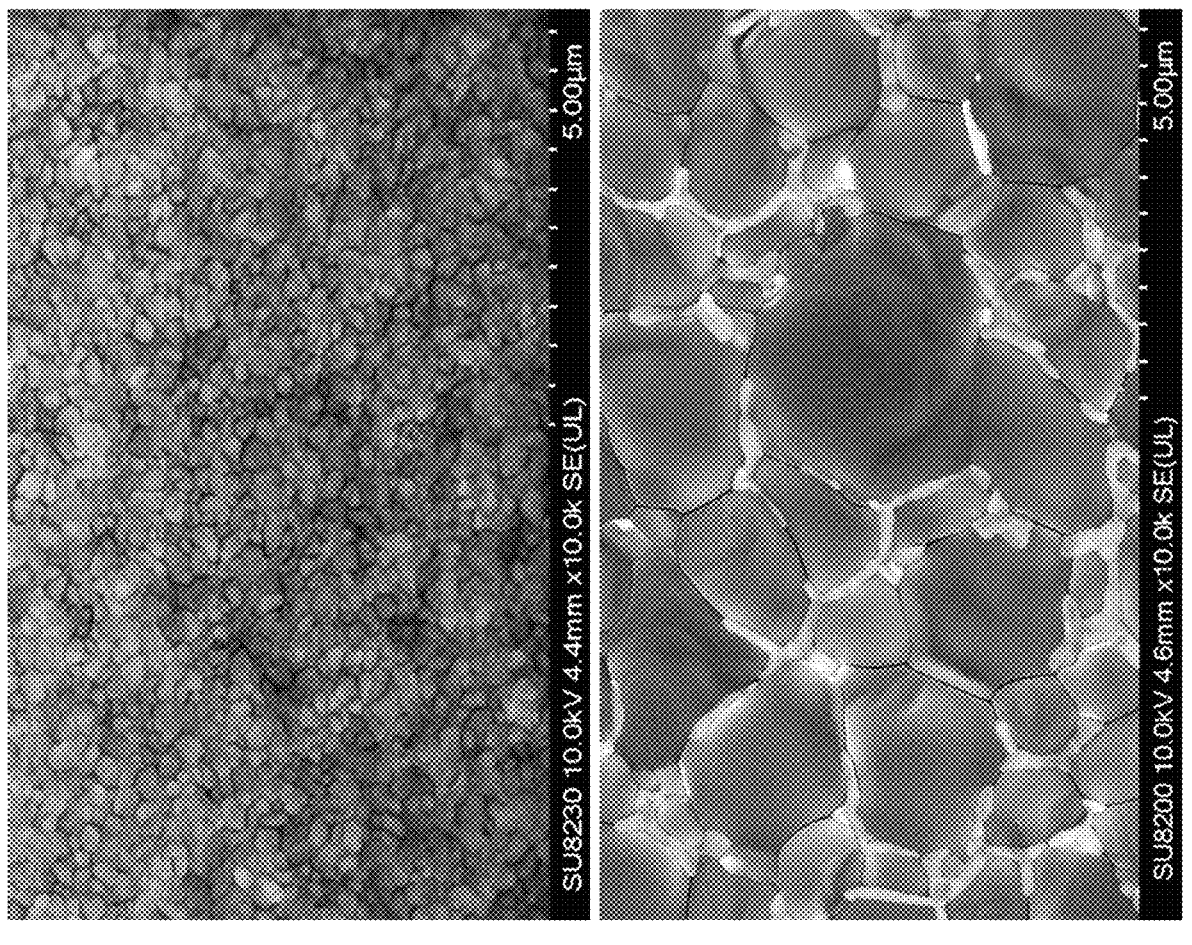
FIG. 2 depicts SEM images of the perovskite films according to the prior art without additive and according to an embodiment of the invention with additive.

Within the following descriptions a perovskite film according to the prior art is referred to as PE-9100 whereas a perovskite film according to an embodiment of the invention is referred to as PE-9500. FIGS. 2A and 2B depict respectively SEM images of these films as deposited onto a $TiO_2$ compact layer ($TiO_2$—CL). As can be seen, the two films have different morphologies. Without the dopant additive, the film is very compact, constituted by very fine grains of average size ~200 nm. In contrast, the novel perovskite film with additive shows relatively large grains of size between 2 μm and 4 μm. One can clearly see the material with a white contrast at most of the grain boundaries. Indeed, the SCN additive approach employed by the inventors in forming their novel perovskite materials and films improves the grain size of the perovskite films and also removes the detrimental effect of the formation of excessive lead iodide ($PbI_2$) at the grain boundaries. Accordingly, the reduced use of $PbI_2$ with the SCN additive dramatically impacts the microstructural properties of the novel halide ternary perovskites according to embodiments of the invention.

Figures 3A, 3B, 3C, 3D:
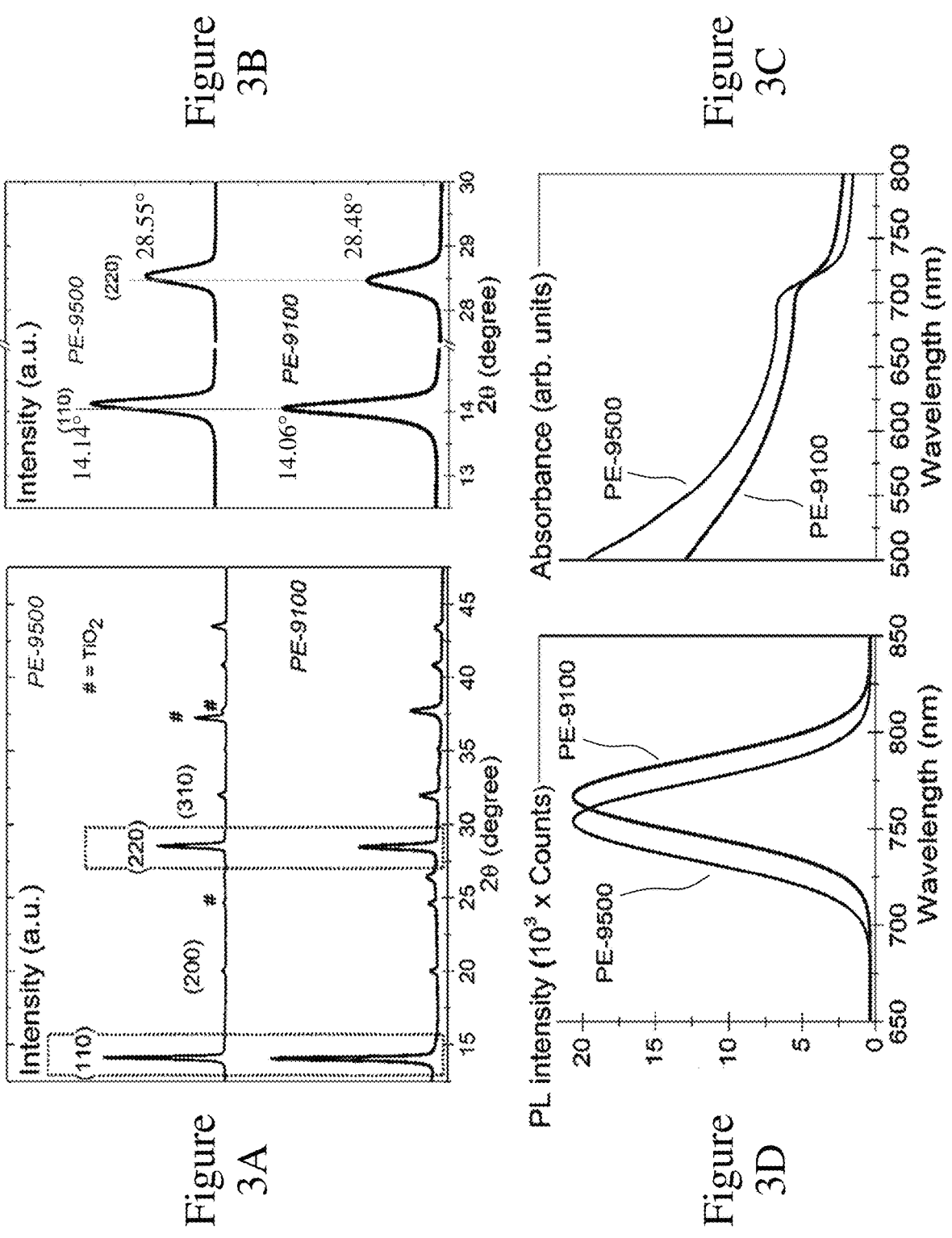
FIG. 3 depicts XRD spectra, magnified XRD spectra, UV-Visible absorption and photoluminescence spectra for of perovskite films without (PE-9100) and with (PE-9500) additive.

Referring to FIG. 3A there are depicted X-ray diffraction patterns for the films PE-9100 (without dopant) and PE-9500 (with dopant). The X-ray diffraction patterns acquired match well to the tetragonal structure for halide perovskites. It should be noted that the whitish material evident at the grain boundaries is not purely $PbI_2$, as the peak at 12.6° is absent in both spectra. This indicates that both films are completely converted to perovskite after the annealing process. Moreover, the effect of the doping on the peak position can be seen in FIG. 3B which is a magnified plot of part of FIG. 3A. It is evident from these that the novel perovskite film with the dopant additive has its peaks shifted to higher angle as a consequence of to the substitution of I anions by the $SCN^-$ dopant, making the lattice parameter smaller.

The observations of perovskite diffraction patterns that match well with halide perovskites and the absence of $PbI_2$ at the grain boundaries (GBs) are both indicative of the fact that both nucleation and crystallization of the films are well controlled. Furthermore, the effect of the doping on the peak positions is also shown in FIG. 3B where the peaks at (110) and (220) for the perovskite shift to higher angles (for instance, 14.060 to 14.14° for (110) plane) as a consequence of the SCN dopant, making the lattice parameter smaller.

Referring to FIG. 3C there are depicted the UV-Visible absorption spectra for the perovskite film according to the prior art and the novel doped perovskite film. In fact, the novel perovskite films exhibit spectra exhibiting good light harvesting behavior with a broad and robust absorption characteristic across the solar spectrum.

FIG. 3D depicts the photoluminescence spectra for the perovskite film according to the prior art and the novel doped perovskite film. The distinctive photoluminescence peaks centered at 770 nm and 753 nm are obtained for PE-9100 and PE-9500 films respectively. The bandgaps estimated from Tauc plot being approximately 1.61 and 1.65 eV for PE-9100 and PE-9500 respectively. Accordingly, the inventors expect minimized current losses and efficient devices based on these thin films since they exhibit large grain, full coverage, dense perovskite film with the absence of voids, which are crucial parameters for an efficient thin-film based-device.

Figure 4:
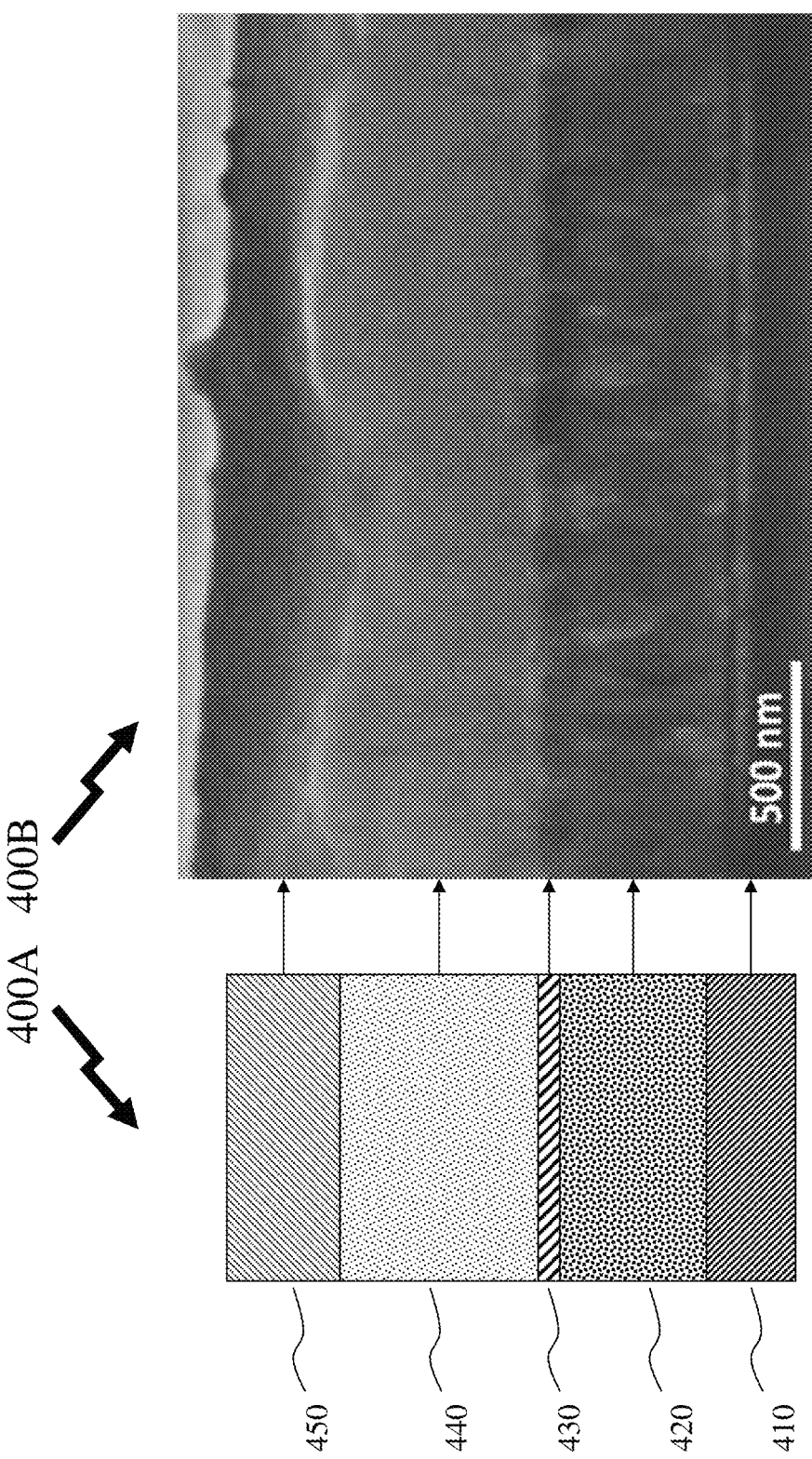
FIG. 4 depicts a schematic of a device architecture implemented using a planar geometry with Glass/FTO/ETM/Perovskite/HTM/metal contact structure together with an SEM cross-section of the fabricated solar cells.

In order to evaluate the performance of the novel perovskite films with additive, the inventors formed photovoltaic devices. First and second images 400A and 400B in FIG. 4A depict, respectively, the architecture and the corresponding SEM cross sectional image of the device. Accordingly, referring to first image 400A the architecture comprises glass substrate 410, FTO 420, $TiO_2$—CL 430, perovskite film 440, and Spiro-MeOTAD 450. In order to compare the devices with the novel perovskite film according to embodiments of the invention the inventors employed a conventional architecture of perovskites based solar cells.

Figure 5:
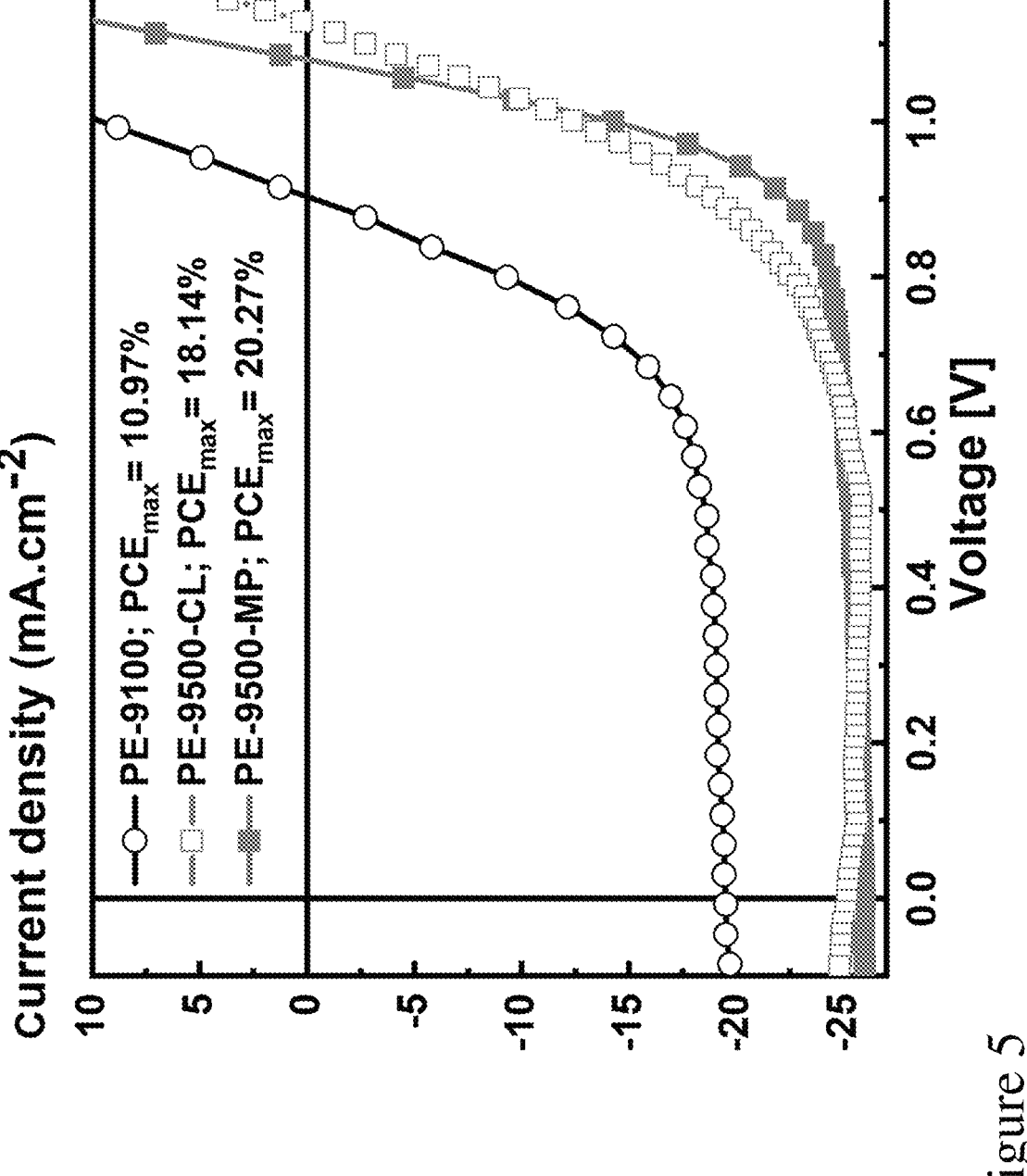
FIG. 5 depicts typical J-V curves, obtained under AM1.5 illumination, of devices made with prior art perovskite without additive (PE-9100-CL), novel perovskite with additive deposited on compact TiO$_2$ (PE-9500-CL), and novel perovskite with additive deposited on mesoporous TiO$_2$ (PE-9500-MP)

FIG. 5 depicts the J-V characteristics obtained under AM 1.5 illumination of devices fabricated with perovskite films with and without the additive as deposited. These being:

PE-9100-CL comprising perovskite film without additive on compact TiO2;

PE-9500-CL comprising perovskite film with additive on compact TiO2; and

PE-9500-MP comprising perovskite film with additive on mesoporous TiO2.

Table 1 below summarises the performance obtained in reverse scan mode at a scan rate of 100 $mVs^{-1}$ wherein $J_{SC}$ is the short circuit current density, $V_{OC}$ the open circuit voltage, FF is the fill factor and PCE is the power conversion efficiency. These are presented with their corresponding standard deviation. For the different devices studied here (with compact $TiO_2$ layer and with mesoporous $TiO_2$) the efficiency of the devices with additive are found to be much higher than the devices without additive. Indeed, for the devices made with $TiO_2$ compact layer (PE-9100-CL and PE-9500-CL), an improvement of 64% in the power conversion efficiency is obtained as the SCN dopant is added (i.e., 11.0% for PE-9100-CL versus 18.1% for PE-9500-CL). Similar improvement has been obtained in the efficiency of the samples fabricated with mesoporous $TiO_2$ as electron transport layer. As evident from Table 1, the initial prototype devices according to embodiments of the invention with additive manufacturing exhibit higher PV parameters than the devices without dopant.

TABLE 1

| J-V Measurements on Perovskite Film Solar Cells | | | | | |
|---|---|---|---|---|---|
| Film | $J_{SC}$ (mA · $cm^{-2}$) | $V_{OC}$ (V) | FF (%) | PCE (%) | $PCE_{AVG}$ (%) |
| PE-9100-CL | 19.50 | 0.91 | 61.9 | 11.0 | 9.73 ± 0.65 |
| PE-9500-CL | 24.98 | 1.13 | 64.3 | 18.1 | 16.43 ± 1.12 |
| PE-9500-MP | 25.79 | 1.08 | 72.8 | 20.3 | 19.05 ± 0.95 |

Compared with the devices with only a compact $TiO_2$ layer, the devices with mesoporous $TiO_2$ layer exhibit a higher FF and a slight increase in PCE. The best efficiency for the PE-9500-MP device is 19.30% with $J_{SC}$ 24.54 mAcm$^{-2}$, $V_{OC}$ 1.07 V and FF: 73.50%. The performance of PE-9500-CL device is closely comparable to that of the PE-9500-MP device. The enhanced performance in the PCE and FF for PE-9500-MP devices could be attributable to the added Li-doped mesoporous-TiO$_2$ layer, which facilitates efficient electron extraction at the perovskite-TiO$_2$ interface and passivates trap states in TiO$_2$. Moreover, the added mesoporous TiO$_2$ layer reduces the direct contact between the perovskite layer and the FTO electrode due to possible voids in the compact TiO$_2$ layer. Hence, the mesoporous layer acts as a buffer layer to effectively prevent leakage current and limits shunt pathways from the perovskite-FTO interface.

Accordingly, the inventors attribute these results to the increased grain size which comes with a decrease of the density of grains boundaries (GBs). Given the high presence of trap states at the GBs, charge carrier can be easily lost at these defects. Reducing the density of GBs is known to be an efficient way to decrease recombinations within perovskite films. In addition, GBs have also been demonstrated to be detrimental to the stability of perovskite based solar cells as they constitute an accessible channel for moisture (water molecules) to penetrate across the perovskite film.

The inventors have established that the new perovskite (whitish material) has improved resistance to moisture (due to the addition of the SCN dopant) where the dopants presence at the grain boundaries leads to more stable devices. In other words, the additive, resulting in the formation of new perovskite at the grain boundaries, is expected to play a passivation role. This has been confirmed by the stability measurements performed on the different devices made without and with the additive. The devices were kept continuously in ambient air without encapsulation at a temperature between 20° C. and 25° C. and at a relative humidity between 30% and 50%.

Figure 6:
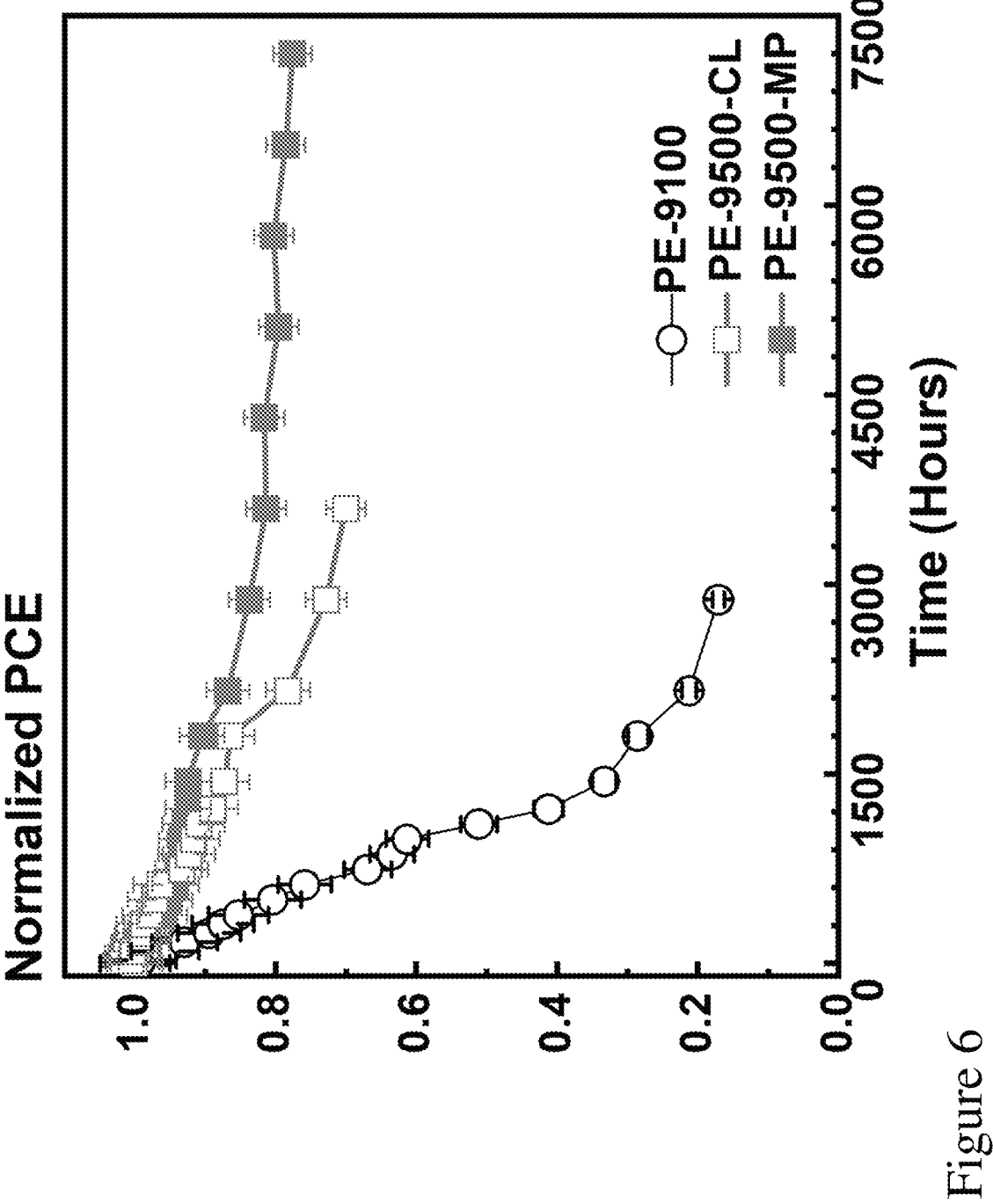
FIG. 6 depicts the normalized efficiency of the different PV devices measured at different periods of time under ambient air showing the improved stability of the novel perovskite films with additive.

FIG. 6 presents the efficiencies of the devices measured at different times over a period of approximately 10 months. The device fabricated without the additive shows a 50% loss in efficiency after 40 days exposure while the devices with additive show only 10% loss after 50 days and 20%/30% after 300 days exposure. Further, there is reduced degradation within the PE-9500-MP film on mesoporous TiO$_2$ versus the PE-9500-CL film formed on compact TiO2. Accordingly, the perovskite with additive is more stable than that without additive. To date within the prior art a stability of perovskite based solar cells has never been demonstrated in ambient air at relative humidity of 40-50% without encapsulation.

In order to assess the cause of degradation the results for a batch of devices were closely compared for the first 1200 hours (50 days). The devices exhibited relatively constant $J_{SC}$ and $V_{OC}$ but varying. As such, the fill factor, show the most significant loss, and thus, remains the main contributor to the observed PCE loss in all the devices. However, these results already demonstrate unparalleled stability under exposure to ambient conditions for devices formed without any specific requirements on processing environment. Accordingly, it would be evident that the perovskite films and their devices can have their performance prolonged via encapsulation to shield the film surfaces from moisture and oxygen, and to decrease surface recombination. Additionally, improved lifetime performance is expected from using more stable electron and hole transport layers.

Photovoltaic Performance of Solar Cells Using Novel Perovskite Material with Inorganic Hole Transporting Layer The inventors have also fabricated and tested solar cells exploiting the novel perovskite materials according to embodiments of the invention with and without the use of copper (1) thiocyanate (CuSCN) as an inorganic hole transporting layer, such as HTL 150 as described and depicted with respect to FIG. 1. Accordingly, perovskite solar cells with the following configurations were fabricated:

FTO/TiO2/perovskite/Au structures exploiting the novel perovskite materials described above but without a CuSCN HTL layer (referred to subsequently and with respect to FIGS. 7 and 8 as without CuSCN); and FTO/TiO2/perovskite/CuSCN/Au structures exploiting the novel perovskite materials described above in conjunction with a CuSCN hole transport layer ((referred to subsequently and with respect to FIGS. 7 and 8 as with CuSCN).

Figure 7:
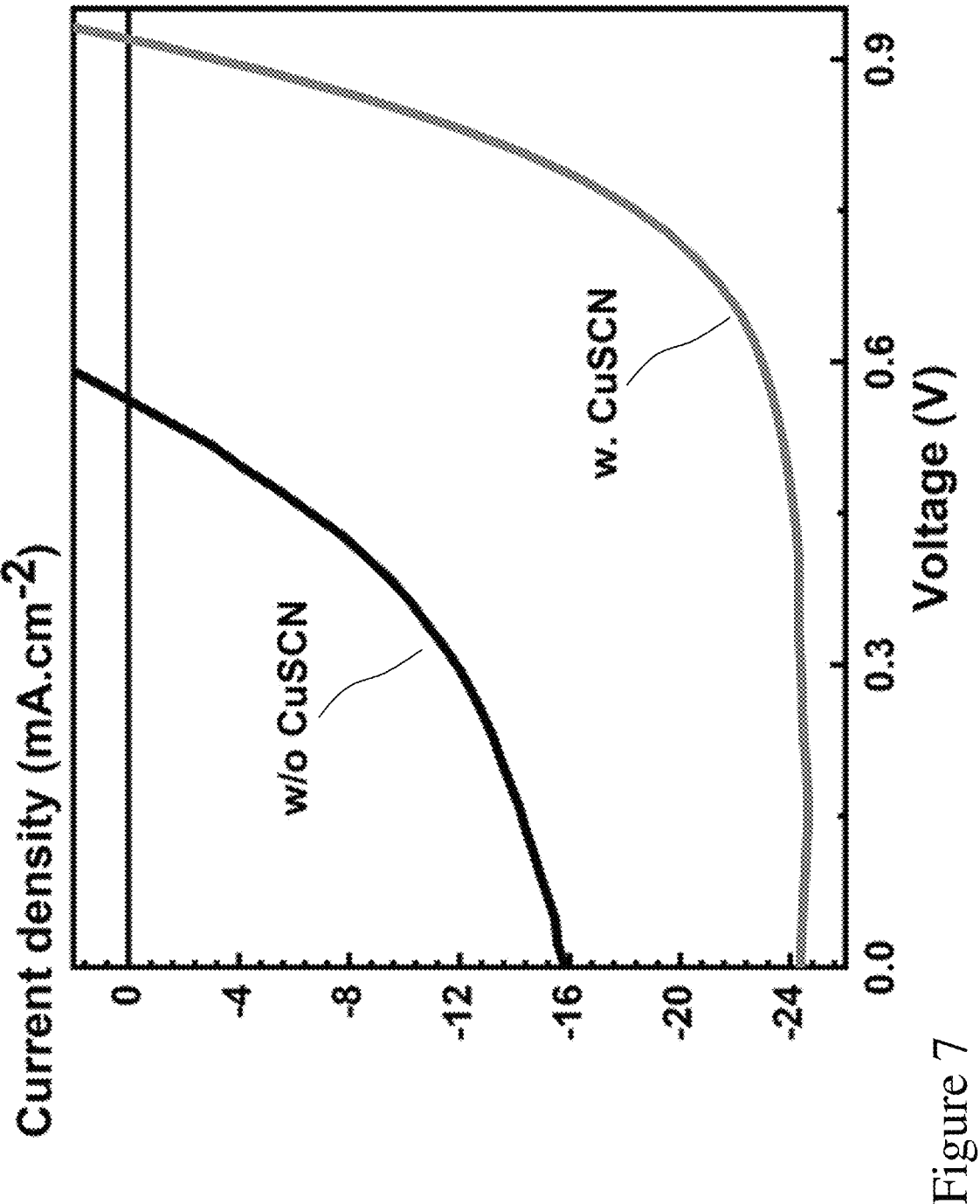
FIG. 7 depicts current density versus voltage curves for perovskite solar cells fabricated with and without the addition of an inorganic hole transporting layer according to an embodiment of the invention.
Figure 8:
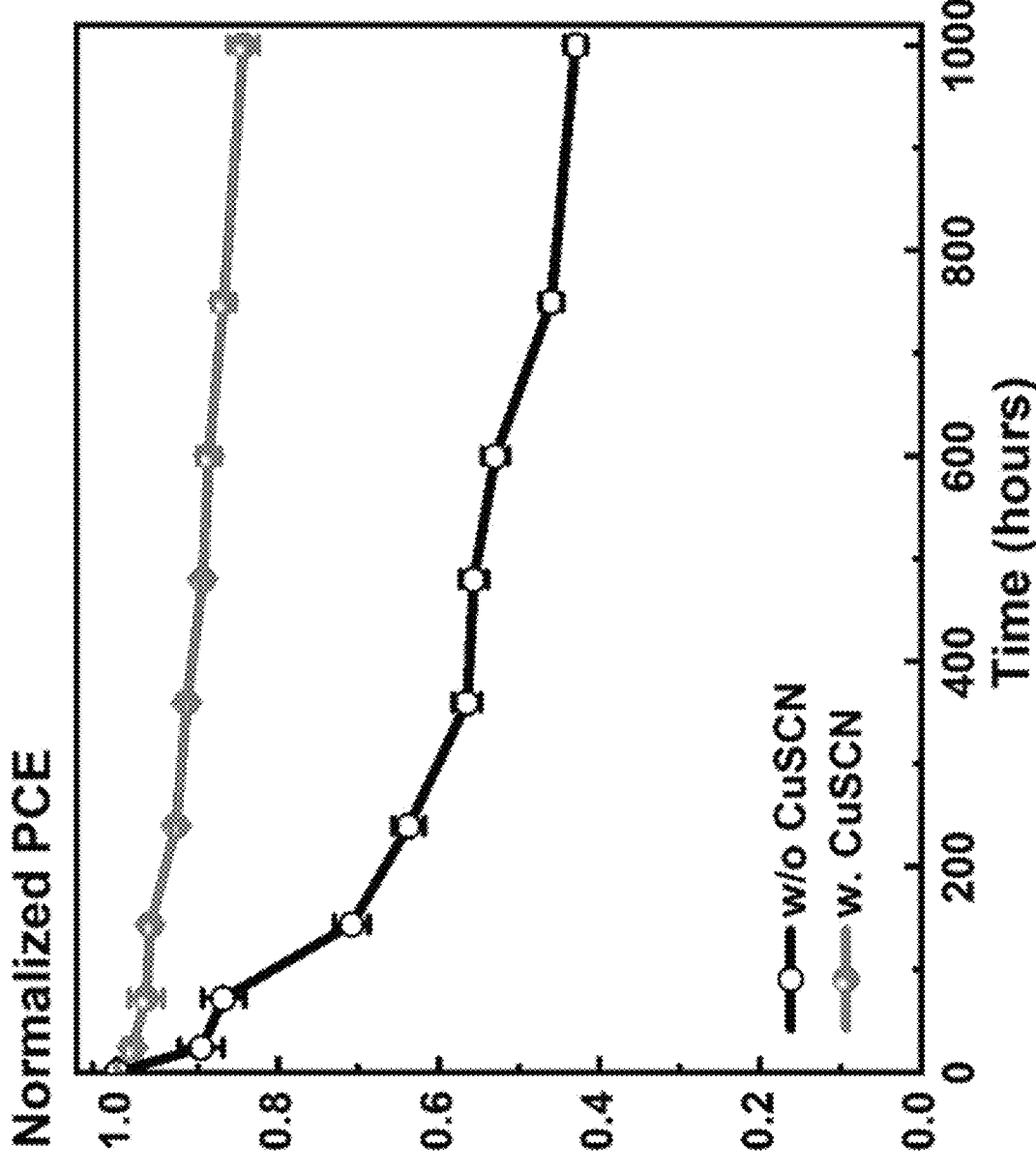
FIG. 8 depicts the evolution with time of the photon conversion efficiency of the perovskite solar cells fabricated with and without the addition of an inorganic hole transporting layer according to an embodiment of the invention.

Referring to FIG. 7 there are depicted the current density-voltage (J-V) curves for devices fabricated without and with the solution-processed CuSCN film as the inorganic hole transport layer.

TABLE 2

Comparison of Best Fabricated Perovskite Solar Cells with and without Inorganic Hole Transport Layer

| Parameter | Without CuSCN | With CuSCN |
|---|---|---|
| Open Circuit Voltage ($V_{OC}$) (V) | 0.56 | 1.00 |
| Short Circuit Current Density ($J_{SC}$) (mA · cm$^{-2}$) | 15.81 | 23.60 |
| Fill Factor (FF) (%) | 41.79 | 62.88 |
| Photon Conversion Efficiency (PCE) (%) | 3.7 | 14.7 |

The devices were measured under simulated AM1.5G solar illumination and the results are summarized in Table 2 above for the best fabricated devices and in Table 3 below for the averages of all fabricated devices. Accordingly, it is evident that the addition of the CuSCN film increases the PCE approximately 4-fold as well as demonstrating significant improvements in $J_{SC}$, $V_{OC}$, and FF values.

TABLE 3

Comparison of Fabricated Perovskite Solar Cells with and without Inorganic Hole Transport Layer

| Parameter | Without CuSCN | With CuSCN |
|---|---|---|
| Open Circuit Voltage ($V_{OC}$) (V) | 0.49 ± 0.07 | 0.95 ± 0.04 |
| Short Circuit Current Density (JSC) (mA · cm$^{-2}$) | 13.22 ± 1.33 | 22.83 ± 0.76 |
| Fill Factor (FF) (%) | 36.40 ± 0.04 | 60 ± 0.04 |
| Photon Conversion Efficiency (PCE) (%) | 2.37 ± 0.61 | 13.29 ± 0.87 |

The stability of these perovskite solar cells with and without CuSCN HTL was evaluated by storing non-encapsulated devices in ambient air. FIG. 8 depicts the evolution of normalized PCE over time for these solar cells. It is evident that the perovskite solar cell without the CuSCN HTL degrades rapidly when exposed to air with its normalized PCE dropping to approximately 43% of its initial PCE (2.37±0.61% as outlined in Table 3). Accordingly, at 1000 hours the PCE for perovskite solar cells without the CuSCN layer had dropped to an approximate average of 1.02%. In contrast, the novel perovskite solar cells with the CuSCN HTL had only dropped to approximately 85% of their initial PCE (13.29±0.87% as outlined in Table 3) after 1000 hours of storage in ambient air. Accordingly, the PCE of the novel perovskite solar cells with the CuSCN HTL had dropped to an average 11/30%. Hence, after 1000 hours the novel perovskite solar cells with the CuSCN HTL function with a PCE an order of magnitude higher than perovskite solar cells without the CuSCN HTL.

The degradation of the perovskite solar cells may originate from the exposure to moisture and its trapping in the perovskite surface, resulting in partial decomposition of the perovskite layer. However, it is evident from the results obtained by the inventors for SCN-based perovskites that they are thermodynamically stable. CuSCN also has good thermal and chemical stability.

Deposition and Stabilization of Novel Perovskite Material with Inorganic Hole Transporting Layer It would be evident that the results and methods described above with respect of the manufacture and deposition of novel perovskite materials according to embodiments of the invention have been performed within a research laboratory environment and accordingly that in high volume manufacturing that one or more additional materials may be required in order to facilitate their manufacture and use.

For example, with respect to stabilization of the perovskite solution these one or more additional materials may include the user of small molecule acceptors (SMAs). Such SMAs may include, but not be limited to, ITIC (2,2'-[[6,6, 12,12-Tetrakis(4-hexylphenyl)-6,12-dihydrodithieno[2,3-d: 2',3'-d']-s-indaceno[1,2-b:5,6-b']dithiophene-2,8-diyl]bis [methylidyne(3-oxo-1H-indene-2,1(3H)-diylidene)]]bis [propanedinitrile]) derivatives which can be dissolved in solvents such as chloroform, chlorobenzene or dichlorobenzene.

For example, with respect to stabilization of the perovskite solution these one or more additional materials may include those which can prevent the deprotonation of methylammonium iodide and/or stabilize yellow δ-phase of formamidinium iodide (FAI) in the perovskite solution. For example, one such material is boric acid ($H_3BO_3$).

For example, with respect to the fabrication of large-scale and flexible devices other deposition techniques such as screen printing, roll-to-roll printing, inkjet printing, slot-die printing, spray coating etc. may be employed which could some modifications of the viscosity of the perovskite solution for example by adjusting the concentration of the solutes or adding the one or more additional materials to adjust viscosity.

For example, with respect to the wettability and surface coverage of the perovskite solution onto substrates this may require the addition of one or more surfactants. For example, one such surfactant could be polyethylene glycol tert-octylphenyl ether.

For example, with respect to manufacturing the one or more additional materials may include inert particles of predetermined dimensions, e.g. nanorods, microrods, microspheres etc. to define a layer thickness with some manufacturing processes such as screen printing for example.

Accordingly, the inventors have established a highly efficient and stable halide perovskite material that can be processed and produced by using anion substitution, solvent treatment, and processing steps without requirements for environmental control. Processes according to embodiments of the invention provide robust and facile route for synthesizing high-quality perovskite thin films at a low temperature (120° C.), with high reproducibility, high-performance, and stability under ambient conditions. Embodiments of the invention provide a low-cost method for the fabrication of organic-inorganic hybrid perovskite-based devices by solution processing and deposition of the perovskite precursor compounds, from elements that are earth-abundant and readily available materials. The said halide perovskite materials exhibit excellent and tunable optoelectronic properties for light-absorption, light-detection, and light-emission.

The photoactive halide perovskite thin film can be used to produce devices such as heterojunction solar cells, photodetectors, light-emitting diodes, lasing devices and tandem solar cells. For instance, a solar cell can be fabricated depositing an organic-inorganic halide perovskite between an electron transport (n-type) layer and a hole transport (p-type) layer, to enhance charge separation and transport of photo-generated carriers in the device. Devices have been demonstrated with high performance using both compact and mesoporous n-type materials deposited in ambient conditions.

Embodiments of the invention allow for devices exploiting novel perovskite films can be arranged in different device architectures in either planar or inverted device architecture. Typically, the perovskite thin film deposited forms a planar architecture with an n-type (such as titanium dioxide, $TiO_2$ compact or mesoporous microstructure, PCBM) and a p-type (Spiro-MeOTAD, copper thiocyanate, or PEDOT.PSS) layers, and can be formed on both rigid (e.g. glass) and flexible substrates. The conductive glass-coated substrates can be a fluorine-doped tin oxide (FTO) or indium tin oxide (ITO). In another aspect, the tandem cells comprise of a bottom cell which may be a silicon substrate or textured silicon substrates. A flexible substrate can be any conductive polymer such as PET, and polyimide films.

Embodiments of the invention can comprise of the novel halide perovskite layer and carbon-based materials such as single-wall carbon nanotube and graphene layers.

Embodiments of the invention a solar cell device fabrication method can comprise of spin coating of the n-type layer onto a transparent conductive substrate such as FTO or ITO, followed by spin coating of the halide perovskite thin film, then the p-type material is spin-coated from solution atop the photoactive layer and finally a deposition of desirable top metal electrodes such as Au or Ag by sputtering or an evaporation method.

Embodiments of the invention present a similar method for producing light-emitting diodes in ambient conditions. In this embodiment, a thin layer of the halide perovskite is sandwiched between a p-type and n-type layers.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and remain within the spirit and scope of the present invention.

What is claimed is:

1. A method of forming an optoelectronic device comprising:

depositing one or more first layers of the optoelectronic device to form a lower portion of the optoelectronic device;

forming a doped perovskite film as an active layer of the optoelectronic device; and depositing one or more second layers of the optoelectronic device to form an upper portion of the optoelectronic device;

depositing the one or more first layers of the optoelectronic device to form the lower portion of the optoelectronic device comprises:

depositing a lower electrode; and depositing a lower charge extracting structure upon which the doped perovskite film is formed comprising another material deposited upon the lower electrode to provide an electron transport layer between the lower electrode and a semiconductor material deposited upon the material; wherein the semiconductor material is lithium doped mesoporous titanium dioxide;

the doped perovskite film is formed from a doped triple cation perovskite solution established by doping a triple cation perovskite solution; and the doped perovskite film has the composition $FA_X MA_Y CS_Z Pb_M I_V SCN_Q Br_N$ where X, Y, Z, M, V, Q, N may each range between 0.0001 to 3; wherein FA stands for formamidinium;

MA stands for methylammonium;

SCN stands for thiocyanate; and grains of the doped perovskite film are devoid of a coating or shell of a material prior to the deposition of the one or more second layers forming the upper portion of the optoelectronic device where the coating or shell of the material protects the grains of the doped perovskite film from defect generation and passivates the grains of the doped perovskite film.

2. The method according to claim 1, wherein the optoelectronic device is one of a planar solar cell, an inverted solar cell, a mesoporous solar cell, a tandem solar cell, a light emitting diode (LED), and a photodetector.

3. The method according to claim 1, wherein depositing one or more second layers of the optoelectronic device comprises:

depositing an upper electrode; and depositing an inorganic hole transport layer between the upper electrode and the doped perovskite film.

4. A method of forming an optoelectronic device comprising:

depositing one or more first layers of the optoelectronic device to form a lower portion of the optoelectronic device;

depositing a doped perovskite film to form an active layer of the optoelectronic device; and depositing one or more second layers of the optoelectronic device to form an upper portion of the optoelectronic device; wherein the doped perovskite film is formed from a doped triple cation perovskite solution established by doping a triple cation perovskite solution; and the doped perovskite film has the composition $FA_X MA_Y CS_Z Pb_M I_V SCN_Q Br_N$; wherein FA stands for formamidinium;

MA stands for methylammonium;

SCN stands for thiocyanate;

grains of the doped perovskite film are devoid of a coating or shell of a material prior to the deposition of the one or more second layers forming the upper portion of the optoelectronic device where the coating or shell of the material protects the grains of the doped perovskite film from defect generation and passivates the grains of the doped perovskite film;

the doped perovskite film has a first composition or a second composition;

within the first composition:

X lies within the range 0.5 to 1.0;

Y lies within the range 0 to 0.6;

Z lies within the range 0.05 to 0.30;

M lies within the range 0.5 to 1.5;

V lies within the range 2.0 to 3.0;

Q lies within the range 0 to 1.0; and

N lies within the range 0 to 1.0; and within the second composition:

X lies within the range 0.8 to 0.9;

Y lies within the range 0.5 to 0.60;

Z lies within the range 0.10 to 0.20;

M lies within the range 0.9 to 1.1;

V lies within the range 2.25 to 2.75;

Q lies within the range 0.2 to 0.3; and

N lies within the range 0.2 to 0.3.

5. A method of forming an optoelectronic device comprising forming a doped perovskite film directly between a lower electrode structure and an upper electrode structure; wherein the doped perovskite film has the composition $FA_X MA_Y Cs_Z Pb_M I_V SCN_Q Br_N$;

X, Y, Z, M, V, Q, N may each range between 0.0001 to 3;

X and Y may be independently set of each other and independent of Z, M, V, Q and N; and grains of the doped perovskite film are devoid of a coating or shell of a material prior to the deposition of the one or more second layers forming the upper portion of the optoelectronic device where the coating or shell of the material protects the grains of the doped perovskite film from defect generation and passivates the grains of the doped perovskite film; wherein FA denotes formamidinium;

MA denotes methylammonium;

SCN denotes thiocyanate;

X lies within the range 0.8 to 0.9;

Y lies within the range 0.5 to 0.60;

Z lies within the range 0.10 to 0.20;

M lies within the range 0.9 to 1.1;

V lies within the range 2.25 to 2.75;

Q lies within the range 0.2 to 0.3; and

N lies within the range 0.2 to 0.3.

6. A method of forming an optoelectronic device comprising:

depositing one or more first layers of the optoelectronic device to form a lower portion of the optoelectronic device;

forming a doped perovskite film as an active layer of the optoelectronic device;

depositing one or more second layers of the optoelectronic device to form an upper portion of the optoelectronic device; and depositing the one or more first layers of the optoelectronic device to form the lower portion of the optoelectronic device comprises;

depositing a lower electrode; and depositing a lower charge extracting structure upon which the doped perovskite film is formed comprising another material deposited upon the lower electrode to provide an electron transport layer between the lower electrode and a semiconductor material deposited upon the material; wherein the material is one of titanium dioxide, tin oxide and [6, 6]-phenyl-C61-butyric acid methyl ester;

the semiconductor material is lithium doped mesoporous titanium dioxide;

the doped perovskite film is formed from a doped triple cation perovskite solution established by doping a triple cation perovskite solution;

the doped perovskite film has the composition $FA_X MA_Y CS_Z Pb_M SCN_Q Br_N$ where X, Y, Z, M, V, Q, N may each range between 0.0001 to 3;

FA stands for formamidinium;

MA stands for methylammonium;

SCN stands for thiocyanate; and grains of the doped perovskite film are devoid of a coating or shell of a material prior to the deposition of the one or more second layers forming the upper portion of the optoelectronic device where the coating or shell of the material protects the grains of the doped perovskite film from defect generation and passivates the grains of the doped perovskite film.

* * * * *